United States Patent
Lin et al.

(10) Patent No.: US 12,439,533 B2
(45) Date of Patent: Oct. 7, 2025

(54) HEAT INSULATION PAD AND ELECTRONIC DEVICE WITH HEAT INSULATION PAD

(71) Applicant: ASUSTEK COMPUTER INC., Taipei (TW)

(72) Inventors: Yu-Jung Lin, Taipei (TW); Ing-Jer Chiou, Taipei (TW); Cheng-Yu Wang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 251 days.

(21) Appl. No.: 18/328,046

(22) Filed: Jun. 2, 2023

(65) Prior Publication Data

US 2024/0284610 A1 Aug. 22, 2024

(30) Foreign Application Priority Data

Feb. 17, 2023 (TW) ................................ 112105703

(51) Int. Cl.
| | |
|---|---|
| *H05K 5/02* | (2006.01) |
| *B32B 3/26* | (2006.01) |
| *B32B 5/18* | (2006.01) |
| *B32B 7/14* | (2006.01) |
| *B32B 27/06* | (2006.01) |

(52) U.S. Cl.
CPC ............ *H05K 5/0211* (2022.08); *B32B 3/266* (2013.01); *B32B 5/18* (2013.01); *B32B 7/14* (2013.01); *B32B 27/065* (2013.01); *B32B 2307/304* (2013.01); *B32B 2307/7376* (2023.05); *B32B 2457/00* (2013.01)

(58) Field of Classification Search
CPC ......... H05K 5/0211; B32B 3/266; B32B 5/18; B32B 7/14; B32B 27/065; B32B 2307/304; B32B 2307/7376; B32B 2457/00

See application file for complete search history.

(56) References Cited

U.S. PATENT DOCUMENTS

| | | | | |
|---|---|---|---|---|
| 2013/0025839 A1* | 1/2013 | Egitto | .................. | H05K 1/0206 428/137 |
| 2015/0319842 A1* | 11/2015 | Asano | .................... | H05K 1/115 205/125 |
| 2016/0095198 A1* | 3/2016 | Min | ...................... | H05K 1/0206 361/705 |

(Continued)

FOREIGN PATENT DOCUMENTS

| | | |
|---|---|---|
| CN | 104737634 A | 6/2015 |
| CN | 113817327 A | 12/2021 |
| CN | 114103289 A | 3/2022 |

*Primary Examiner* — Jacob R Crum

(74) *Attorney, Agent, or Firm* — Muncy, Geissler, Olds & Lowe, P.C.

(57) ABSTRACT

A heat insulation pad applied to an electronic device is provided. The electronic device includes a housing and a heat source. The housing includes an inner side surface. The heat insulation pad includes a first contact layer, a second contact layer, and a hole layer stack structure. The first contact layer is adapted to attach to the inner side surface. The second contact layer is adapted to contact the heat source. The hole layer stack structure includes a plurality of hole layers stacked in sequence and is located between the first contact layer and the second contact layer. An electronic device with the heat insulation pad is further provided.

11 Claims, 7 Drawing Sheets

(56) References Cited

U.S. PATENT DOCUMENTS

| | | | |
|---|---|---|---|
| 2019/0090346 A1* | 3/2019 | Kondo | H01L 23/49827 |
| 2019/0150272 A1* | 5/2019 | Mayer-Dick | H05K 1/0206 |
| | | | 361/709 |
| 2021/0127479 A1* | 4/2021 | Yu | H05K 3/423 |

* cited by examiner

HEAT INSULATION PAD AND ELECTRONIC DEVICE WITH HEAT INSULATION PAD

CROSS-REFERENCE TO RELATED APPLICATION

This application claims the priority benefit of Taiwan application serial No. 112105703, filed on Feb. 17, 2023. The entirety of the above-mentioned patent application is hereby incorporated by reference herein and made a part of the specification.

BACKGROUND OF THE INVENTION

Field of the Invention

The disclosure relates to a heat insulation pad, and in particular, to a heat insulation pad adapted to be mounted on an inner side of a housing of an electronic device and an electronic device with the heat insulation pad.

Description of the Related Art

With the thinning trend of electronic devices, the distance between a heat source and a housing inside an electronic device is increasingly close. Heat is easily accumulated in positions where airflows in the electronic device are not smooth, causing excessive temperature in local regions of the housing, leading to discomfort in use.

BRIEF SUMMARY OF THE INVENTION

The disclosure provides a heat insulation pad, applied to an electronic device. The electronic device includes a housing and a heat source, and the housing includes an inner side surface. The heat insulation pad includes a first contact layer, a second contact layer, and a hole layer stack structure. The first contact layer is adapted to attach to the inner side surface. The second contact layer is adapted to contact the heat source. The hole layer stack structure includes a plurality of hole layers stacked in sequence and is located between the first contact layer and the second contact layer.

The disclosure further provides an electronic device. The electronic device includes a housing, a heat source, and a heat insulation pad. The housing includes an inner side surface. The heat source is arranged in the housing. The heat insulation pad includes a first contact layer, a second contact layer, and a hole layer stack structure. The first contact layer is adapted to attach to the inner side surface. The second contact layer is adapted to contact the heat source. The hole layer stack structure includes a plurality of hole layers stacked in sequence and is located between the first contact layer and the second contact layer.

The heat insulation pad provided in the disclosure effectively insulates and disperses the heat energy from the heat source in a limited space, thereby avoiding the generation of high-temperature regions on the housing to relieve the discomfort in use.

DETAILED DESCRIPTION OF THE EMBODIMENTS

Specific implementations of the disclosure are described in more detail with reference to the drawings. Advantages and features of the disclosure are clearer according to the following descriptions and claims. It is to be noted that, the drawings adopt a very simplified form and use a non-precise proportion, and are merely used for conveniently and clearly assisting in describing the objective of the embodiments of the disclosure.

Figure 1:
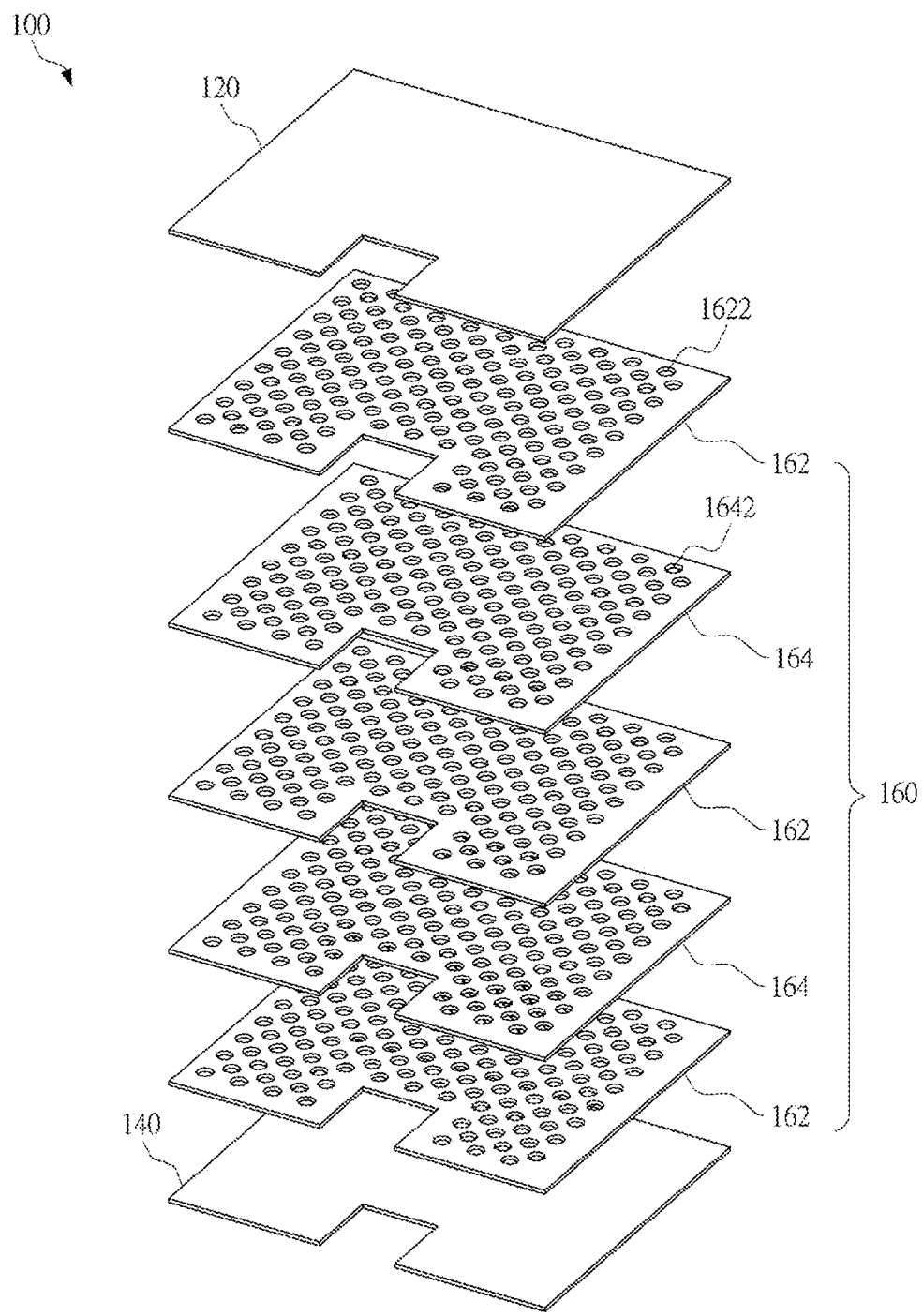
FIG. 1 is a schematic diagram of a heat insulation pad according to a first embodiment of the disclosure.

FIG. 1 is a schematic diagram of a heat insulation pad 100 according to a first embodiment of the disclosure. The heat insulation pad 100 is applied to an electronic device, and prevents heat generated by a heat source inside the electronic device from being transferred to an outer side surface of a housing to affect hand feeling of a user. The electronic device is an electronic device that has a compact structure causing an internal heat source (such as a central processing unit) to be close to an operating position of the user, such as a notebook computer, a tablet computer, or a smartphone.

As shown in FIG. 1, the heat insulation pad 100 includes a first contact layer 120, a second contact layer 140, and a hole layer stack structure 160. The first contact layer 120 is adapted to attach to an inner side surface of the housing of the electronic device. The second contact layer 140 is adapted to contact the heat source. The position where the heat insulation pad 100 is arranged is described in detail in the paragraph corresponding to FIG. 7 subsequently.

The hole layer stack structure 160 includes a plurality of hole layers (at least one first hole layer 162 and at least one second hole layer 164) stacked in sequence and located between the first contact layer 120 and the second contact layer 140. That is, the hole layers are stacked layer by layer from a surface of the first contact layer 120 toward the second contact layer 140 to a direction of the second contact layer 140, or stacked layer by layer from a surface of the second contact layer 140 toward the first contact layer 120 to a direction of the first contact layer 120.

The hole layer stack structure 160 of this embodiment includes three first hole layers 162 and two second hole layers 164 alternately stacked between the first contact layer 120 and the second contact layer 140. The first hole layer 162 is provided with a plurality of first holes 1622, and the second hole layer 164 is provided with a plurality of second holes 1642 corresponding to the first holes 1622 respectively. The first holes 1622 on the first hole layer 162 are arranged in an array, and the second holes 1642 on the second hole layer 164 are also arranged in an array, but the first holes 1622 on the first hole layer 162 are staggered from the second holes 1642 on the second hole layer 164.

In an embodiment, the first hole layer 162 and the second hole layer 164 are polymer layers with holes. Both the first contact layer 120 and the second contact layer 140 are polymer layers without holes to facilitate the formation of a plurality of cavities in the hole layer stack structure 160 to improve the heat insulation effect.

Figure 2:
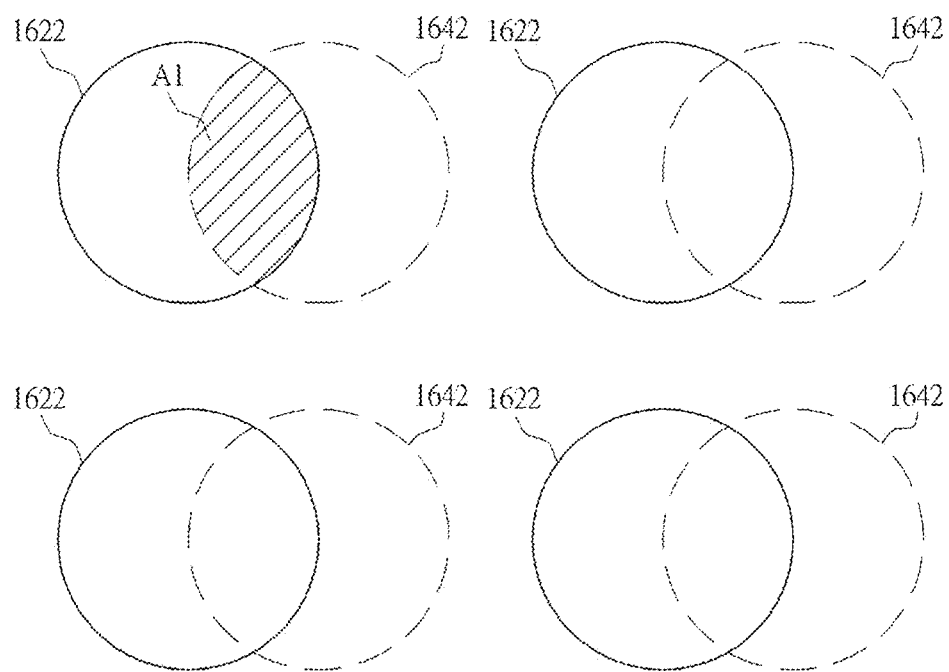
FIG. 2 shows an embodiment of a relative positional relationship between a first hole and a second hole in the hole layer stack structure in FIG. 1.

Referring to FIG. 2 together, FIG. 2 shows an embodiment of a relative positional relationship between the first hole 1622 and the second hole 1644 in the hole layer stack structure 160 in FIG. 1. In FIG. 2, the first hole 1622 is denoted by a solid line and the second hole 1642 is denoted by a dashed line for illustration.

As shown in FIG. 2, the first hole 1622 and the second hole 1642 are both circular holes. Each second hole 1642 partially overlaps the corresponding first hole 1622. In this way, a plurality of curved cavities is formed in the hole layer stack structure 160 and extend from the first contact layer 120 to the second contact layer 140 to suppress the transfer of temperature and increase the thermal resistance of a conduction path between the heat source and the housing (the conduction path needs to bypass the curved cavity and becomes longer).

In an embodiment, an overlapping area A1 of the second hole 1642 and the corresponding first hole 1622 is less than 50% of an area of the second hole 1642 or the first hole 1622.

In an embodiment, diameters of the first hole 1622 and the second hole 1642 are both less than 8 mm, which ensures that the hole layer stack structure 160 has sufficient structural strength to prevent the first contact layer 120 from directly contacting the second contact layer 140 through the cavity formed by the first hole 1622 and the second hole 1642 to affect the heat insulation effect.

In an embodiment, a thickness of the first hole layer 162 and the second hole layer 164 ranges from 0.1 mm and 1 mm, to ensure that the first hole layer 162 and the second hole layer 164 have sufficient structural strength to facilitate manufacturing and avoid that the heat insulation pad 100 is too thick to mount.

In an embodiment, to simplify the manufacturing cost, the first hole layer 162 and the second hole layer 164 have substantially the same structure. That is, the first hole 1622 and the second hole 1642 have the same size, and a spacing between the adjacent first holes 1622 and a spacing between the adjacent second holes 1642 are the same.

Figure 3:
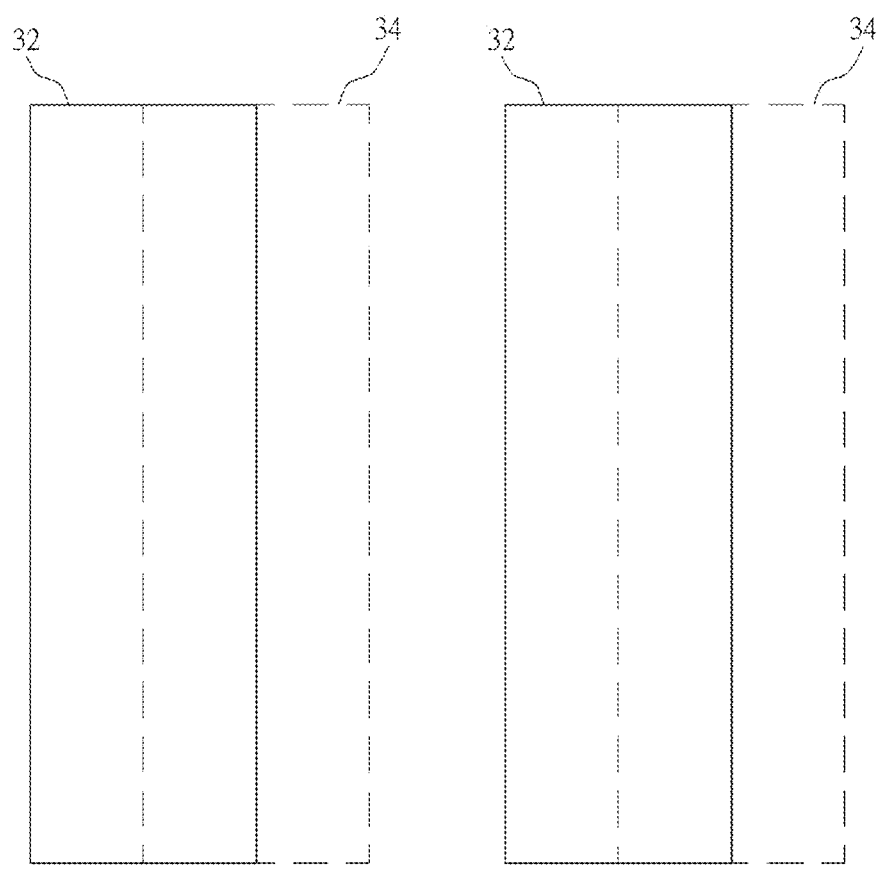
FIG. 3 shows another embodiment of the relative positional relationship between the first hole and the second hole in the hole layer stack structure.

FIG. 3 shows another embodiment of the relative positional relationship between the first hole and the second hole in the hole layer stack structure. FIG. 3 shows shapes of the first hole 32 and the second hole 34 in the hole layer stack structure and the relative positional relationship. In FIG. 3, the first hole 32 is denoted by a solid line and the second hole 34 is denoted by a dashed line for illustration. The hole layer stack structure adopts a stacking method similar to the hole layer stack structure 160 in FIG. 1.

Different from the embodiment in FIG. 2 in which the first hole 1622 and the second hole 1642 are both circular holes, the first hole 32 and the second hole 34 in this embodiment are square holes, and each second hole 34 partially overlaps the corresponding first hole 32.

Holes of other shapes, such as triangle, oval, and hexagon, are also applicable to the disclosure, to increase the thermal resistance of the conduction path between the heat source and the housing and improve the heat insulation effect.

Figure 4:
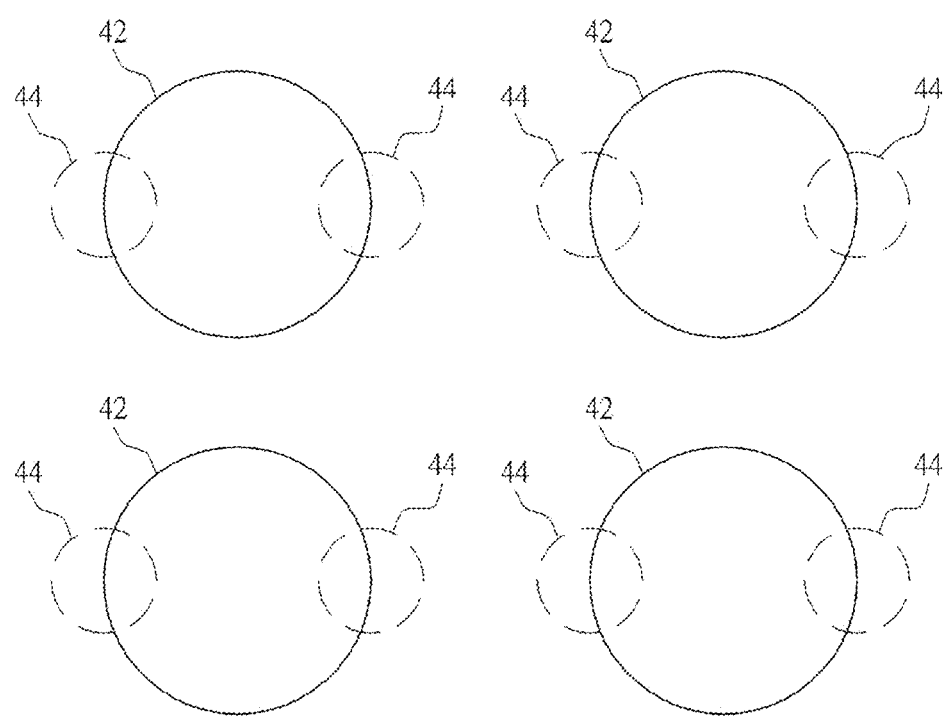
FIG. 4 shows yet another embodiment of the relative positional relationship between the first hole and the second hole in the hole layer stack structure.

FIG. 4 shows yet another embodiment of the relative positional relationship between the first hole and the second hole in the hole layer stack structure. FIG. 4 shows shapes of the first hole 42 and the second hole 44 in the hole layer stack structure and the relative positional relationship. In FIG. 4, the first hole 42 is denoted by a solid line and the second hole 44 is denoted by a dashed line for illustration. The hole layer stack structure adopts a stacking method similar to the hole layer stack structure 160 in FIG. 1.

Different from the embodiment in FIG. 2 in which each second hole 1642 corresponds to a single first hole 1622 and partially overlaps the corresponding first hole 1622, each second hole 44 in this embodiment corresponds to a plurality of first holes 42 at the same time and partially overlaps the first holes 42.

In an embodiment, as shown in FIG. 4, each second hole 44 corresponds to two first holes 42, and the two first holes 42 are arranged at positions corresponding to two opposite sides of the second hole 44, and both partially overlap the second hole 44. In this way, a plurality of curved and bifurcated cavities is formed in the hole layer stack structure to suppress the transfer of temperature.

Figure 5:
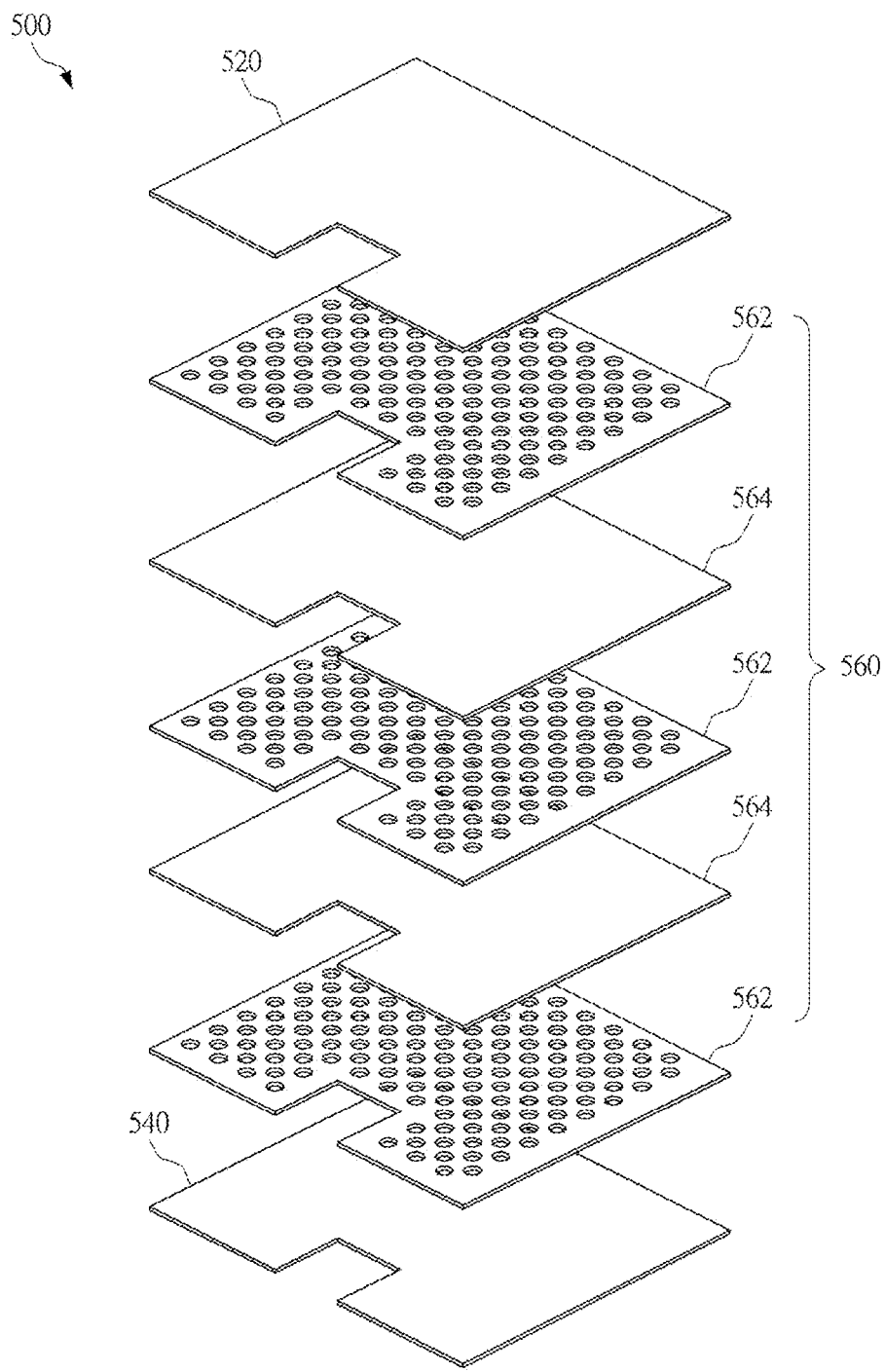
FIG. 5 is a schematic diagram of a heat insulation pad according to a second embodiment of the disclosure.

FIG. 5 is a schematic diagram of a heat insulation pad 500 according to a second embodiment of the disclosure.

Compared with the embodiment in FIG. 1, the heat insulation pad 500 of this embodiment includes a first contact layer 520, a second contact layer 540, and a hole layer stack structure 560, However, in addition to a plurality of hole layers 562, the hole layer stack structure 560 of this embodiment further includes at least one intermediate layer 564 sandwiched between the hole layers 562. The hole layer stack structure 560 of this embodiment includes three hole layers 562 and two intermediate layers 564 alternately stacked between the first contact layer 520 and the second contact layer 540.

In an embodiment, as shown in FIG. 5, the uppermost layer and the lowermost layer of the hole layer stack structure 560 are both hole layers 562, the intermediate layers 564 and the hole layers 562 are alternately stacked between the first contact layer 520 and the second contact layer 540, and a plurality of uniformly distributed cavities is formed in the heat insulation pad 500 to improve the heat insulation effect.

In an embodiment, the hole layer 562 is a foam layer, and the intermediate layer 564 is a polymer layer without holes. In other embodiments, the hole layer 562 is alternatively a polymer layer with holes.

In an embodiment, the positions of the holes of the hole layers 562 in the hole layer stack structure 560 are aligned with each other. In other embodiments, the positions of the holes of the hole layers 562 in the hole layer stack structure 560 are alternatively staggered from each other.

Figure 6:
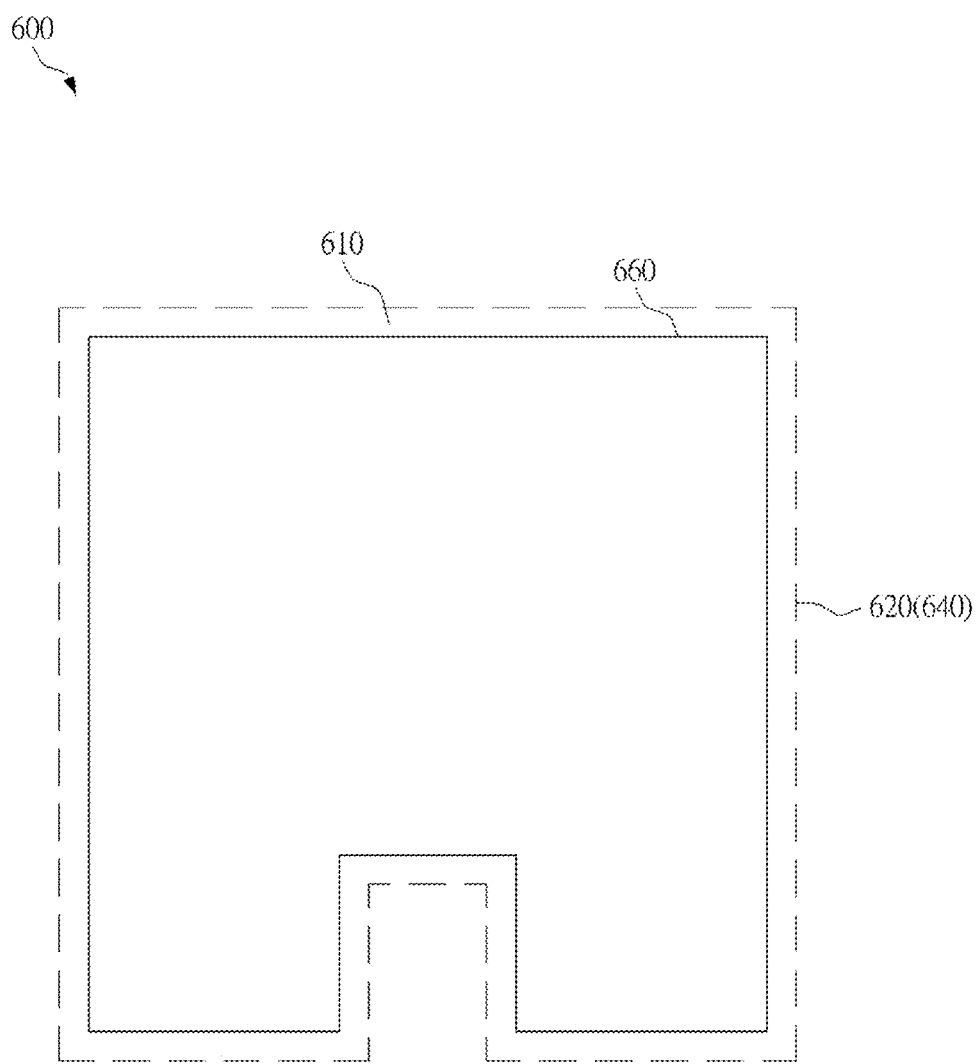
FIG. 6 is a schematic diagram of a heat insulation pad according to a third embodiment of the disclosure.

FIG. 6 is a schematic diagram of a heat insulation pad 600 according to a third embodiment of the disclosure.

Compared with the embodiment in FIG. 1, the heat insulation pad 600 of this embodiment includes an edge sealing structure 610. The edge sealing structure 610 surrounds the hole layer stack structure 660 and is connected to the first contact layer 620 and the second contact layer 640 to seal the hole layer stack structure 660 between the first contact layer 620 and the second contact layer 640. In an embodiment, edge regions of the first contact layer 620 and the second contact layer 640 are directly combined by thermal fusion bonding to form the edge sealing structure 610.

Figure 7:
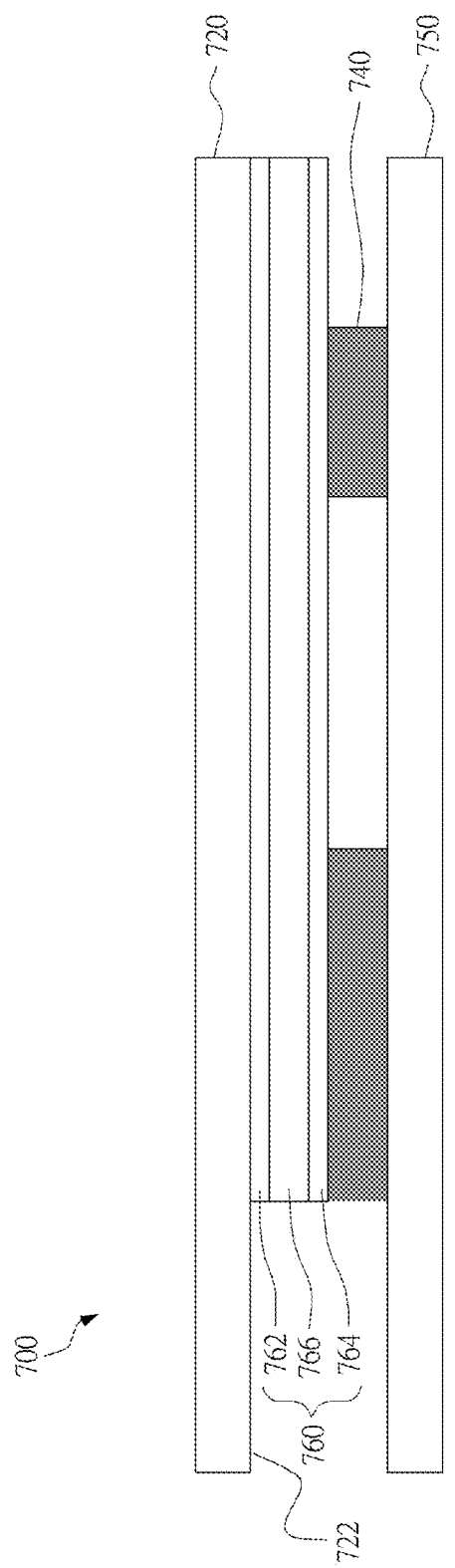
FIG. 7 is a partial schematic diagram of an electronic device with a heat insulation pad according to an embodiment of the disclosure.

FIG. 7 is a partial schematic diagram of an electronic device 700 with a heat insulation pad according to an embodiment of the disclosure. The electronic device 700 is an electronic device that has a compact structure causing an internal heat source (such as a central processing unit) to be close to an operating position of the user, such as a notebook computer, a tablet computer, or a smartphone.

As shown in FIG. 7, the electronic device 700 includes a housing 720, a heat source 740, and a heat insulation pad 760. The housing 720 includes an inner side surface 722. The heat source 740 is arranged in the housing 720. In an embodiment, the heat source 740 is a central processing unit (CPU), a graphics processing unit (GPU), or a support connected to the processing element. The heat source 740 is arranged on a motherboard 750.

The heat insulation pad 760 includes a first contact layer 762, a second contact layer 764, and a hole layer stack structure 766. The first contact layer 762 is adapted to attach to the inner side surface 722. The second contact layer 764 is adapted to contact the heat source 740. The hole layer stack structure 766 is located between the first contact layer 762 and the second contact layer 764, and includes a plurality of hole layers (not shown) stacked in sequence between the first contact layer 762 and the second contact layer 764. The heat insulation pad 760 is the heat insulation pad 100, 500, or 600 shown in FIG. 1, FIG. 5, or FIG. 6.

The heat insulation pad 760 provided in the disclosure effectively insulates and disperses the heat energy from the heat source 740 in a limited space, to reduce the surface temperature of the housing 720, thereby avoiding the generation of high-temperature regions on the housing 720 to relieve the discomfort in use.

The above descriptions are merely exemplary embodiments of the disclosure and do not limit the disclosure. Variations such as equivalent replacements or modifications in any form made by any person skilled in the art to the technical means and technical contents disclosed in the disclosure without departing from the technical means of the disclosure are contents not departing from the technical means of the disclosure and still fall within the protection scope of the disclosure.

What is claimed is:

1. A heat insulation pad, applied to an electronic device, wherein the electronic device comprises a housing and a heat source, the housing comprises an inner side surface, and the heat insulation pad comprises:
    a first contact layer, adapted to attach to the inner side surface;
    a second contact layer, adapted to contact the heat source; and
    a hole layer stack structure, comprising a plurality of hole layers stacked in sequence and located between the first contact layer and the second contact layer,
    wherein both the first contact layer and the second contact layer are polymer layers without holes.

2. The heat insulation pad according to claim 1, wherein the hole layers comprise a first hole layer and a second hole layer, the first hole layer is provided with a plurality of first holes, the second hole layer is provided with a plurality of second holes corresponding to the first holes respectively, and each second hole partially overlaps the corresponding first hole.

3. The heat insulation pad according to claim 2, wherein an overlapping area of the second hole and the corresponding first hole is less than 50% of an area of the second hole or the first hole.

4. The heat insulation pad according to claim 2, wherein the first hole and the second hole have the same size.

5. The heat insulation pad according to claim 1, further comprising at least one intermediate layer sandwiched between the hole layers.

6. The heat insulation pad according to claim 5, wherein the hole layer is a foam layer and the intermediate layer is a polymer layer without holes.

7. The heat insulation pad according to claim 5, wherein the hole layer is a polymer layer with holes and the intermediate layer is a polymer layer without holes.

8. The heat insulation pad according to claim 1, wherein a thickness of the hole layer ranges from 0.1 mm to 1 mm.

9. The heat insulation pad according to claim 1, wherein the hole layer is provided with a plurality of holes, and a diameter of the hole is less than 8 mm.

10. The heat insulation pad according to claim 1, further comprising an edge sealing structure surrounding the hole layer stack structure and connected to the first contact layer and the second contact layer to seal the hole layer stack structure between the first contact layer and the second contact layer.

11. An electronic device, comprising:
    a housing, comprising an inner side surface;
    a heat source, arranged in the housing; and
    a heat insulation pad, comprising:
        a first contact layer, adapted to attach to the inner side surface;
        a second contact layer, adapted to contact the heat source; and
        a hole layer stack structure, comprising a plurality of hole layers stacked in sequence and located between the first contact layer and the second contact layer,
    wherein both the first contact layer and the second contact layer are polymer layers without holes.

* * * * *